US009194906B2

(12) United States Patent
Miyazono

(10) Patent No.: US 9,194,906 B2
(45) Date of Patent: Nov. 24, 2015

(54) PROBE APPARATUS

(71) Applicant: TOKYO ELECTRON LIMITED, Tokyo (JP)

(72) Inventor: Mitsuyoshi Miyazono, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 284 days.

(21) Appl. No.: 13/845,937

(22) Filed: Mar. 18, 2013

(65) Prior Publication Data

US 2013/0249581 A1 Sep. 26, 2013

(30) Foreign Application Priority Data

Mar. 26, 2012 (JP) ................................ 2012-070197

(51) Int. Cl.
*G01R 31/20* (2006.01)
*G01R 31/26* (2014.01)
*G01R 31/28* (2006.01)

(52) U.S. Cl.
CPC ........ *G01R 31/2601* (2013.01); *G01R 31/2887* (2013.01); *G01R 31/2891* (2013.01)

(58) Field of Classification Search
CPC ........... G01R 31/2886; G01R 31/2887; G01R 31/2891; G01R 1/07342; G01R 1/06705
USPC ............ 324/756.03, 755.01, 754.03, 750.16, 324/762.01, 750.25, 754.08, 750.19, 324/756.01; 414/331.02, 754
See application file for complete search history.

(56) References Cited

U.S. PATENT DOCUMENTS 6,060,892 A * 5/2000 Yamagata ............... 324/754.07

FOREIGN PATENT DOCUMENTS

JP 2010-80775 A 4/2010

* cited by examiner

*Primary Examiner* — Son Le
(74) *Attorney, Agent, or Firm* — Nath, Goldberg & Meyer; Jerald L. Meyer

(57) ABSTRACT

A probe apparatus is provided, comprising a card clamp mechanism configured to detachably clamp a probe card equipped with a plurality of probes; a wafer chuck configured to mount a semiconductor wafer thereon and configured to provide contact between electrodes formed in the semiconductor wafer with the probes of the probe card clamped by the card clamp mechanism with an operation of a drive mechanism; and a card movement mechanism configured to move the card clamp mechanism and the probe card clamped by the card clamp mechanism to at least two positions spaced at a predetermined distance.

5 Claims, 6 Drawing Sheets

: center of probe card probe apparatus for 300 mm
600×600mm
(0. 36m²)
In the case where
probe card
is fixed
Embodiment probe apparatus for 450 mm
900×900mm
(0. 81m²)
2.25 times 675×675mm
(0. 46m²)
1.27 times 920(W) × 1,423(D)mm 1,193(W) × 1,423(D)mm 920(W)×1,735(D)mm

PROBE APPARATUS

CROSS-REFERENCE TO RELATED APPLICATION

This application claims the benefit of and priority to Japanese Patent Application No. 2012-070197, filed on Mar. 26, 2012, in the Japan Patent Office, the disclosure of which is incorporated herein in its entirety by reference.

TECHNICAL FIELD

The present disclosure relates to a probe apparatus.

BACKGROUND

In a process of fabricating a semiconductor device, a probe apparatus is used to perform an electrical inspection on a semiconductor device which is formed on a semiconductor wafer. Such a probe apparatus uses a probe card including a plurality of probes which are brought into contact with electrode pads formed on the semiconductor wafer.

In a conventional probe apparatus, an electrical conduction between each of the probes of the probe card and each of electrodes of the semiconductor device to be measured which is formed on the semiconductor wafer is established. Subsequently, the electrical inspection of the semiconductor device to be measured is performed by supplying an inspection signal provided from a tester to the semiconductor device to be measured through each of the probes, and measuring a signal received from the semiconductor device to be measured.

As described above, the conventional probe apparatus moves the wafer chuck with respect to the fixed probe card so that each of the electrodes of the semiconductor device to be measured, which is formed on the semiconductor wafer mounted on the wafer chuck, is brought into contact with a corresponding probe of the fixed probe card.

In recent years, a diameter of the semiconductor wafer has been increased, for example, from 300 mm to 450 mm. As such, the probe apparatus for measuring the semiconductor wafer having such a large diameter inevitably needs to increase or adjust its wafer inspection range for accommodating the larger wafers. Therefore, a probe apparatus having capabilities to restrain the range of movement to conserve the real estate of the wafer inspection region is required.

SUMMARY

Some embodiments of the present disclosure provide a probe apparatus which is capable of restraining the area of movement to reduce the real estate of the wafer inspection region.

According to one embodiment of the present disclosure, provided is a probe apparatus including a card clamp mechanism configured to detachably clamp a probe card equipped with a plurality of probes, a wafer chuck configured to mount a semiconductor wafer thereon and configured to provide contact between electrodes formed in the semiconductor wafer with the probes of the probe card clamped by the card clamp mechanism with an operation of a drive mechanism, and a card movement mechanism configured to move the card clamp mechanism and the probe card clamped by the card clamp mechanism to at least two positions spaced at a predetermined distance.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
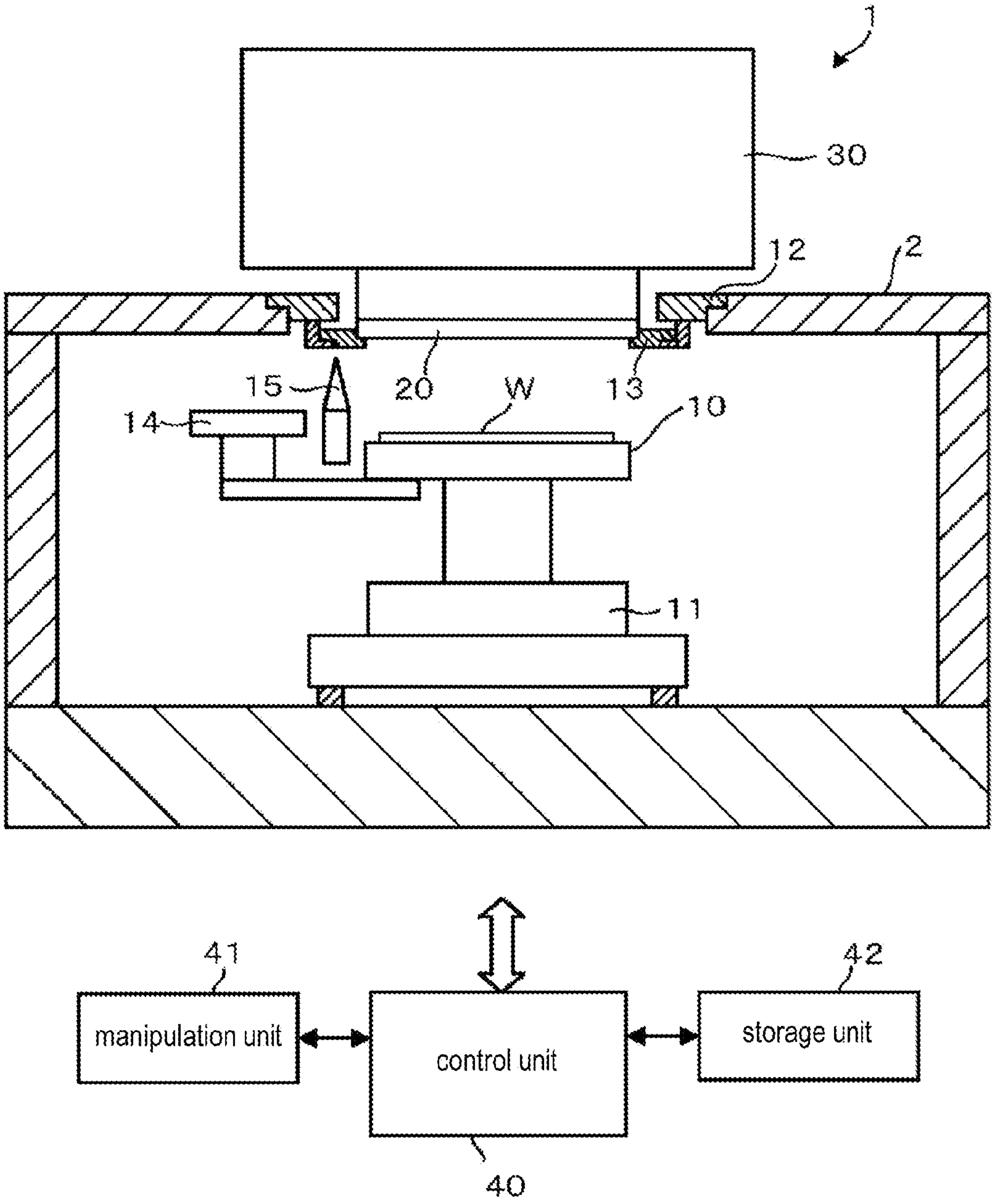
FIG. 1 is a schematic sectional view showing a configuration of a probe apparatus according to some embodiments.

A configuration of a probe apparatus 1, which performs an inspection process on a semiconductor device formed on a semiconductor wafer will be described with reference to FIG. 1. As shown in FIG. 1, the probe apparatus 1 includes a frame 2 within which a wafer chuck 10 configured to mount a semiconductor wafer W thereon is disposed. The wafer chuck 10 includes a drive mechanism 11 so that it is movable in x, y, z and θ directions.

In the frame 2, a circular opening is formed above the wafer chuck 10. An insert ring 12 is disposed along a peripheral portion of the circular opening. A card clamp mechanism 13 is installed in the insert ring 12. A probe card 20 is detachably held by the card clamp mechanism 13.

The probe card 20 includes a wiring substrate, a plurality of probes (not shown) electrically connected to the wiring substrate, and others. Each of the plurality of probes of the probe card 20 is disposed corresponding to each electrode of the semiconductor device formed on the semiconductor wafer W.

A probe polishing board 14 configured to polish end portions of the probes, and a camera 15 which is disposed with its lens directed upward and is configured to image an upper side, are disposed at a side of the wafer chuck 10. The camera 15 may include, e.g., CCD (Charge-Coupled Device) camera and is configured to image, e.g., the probes of the probe card 20 such that the probes are aligned to the respective electrodes.

A test head 30, which is connected to a tester that sends testing signals to the semiconductor device and receives signals reflected therefrom to thereby inspect a status of the semiconductor device, is disposed above the probe card 20.

Although not shown in FIG. 1, but as shown in FIGS. 2A to 4, the probe apparatus 1 includes a card movement mechanism which is configured to horizontally move the insert ring 12, the card clamp mechanism 13, the probe card 20 installed in the card clamp mechanism 13, and the test head 30. This configuration reduces the real estate of the wafer inspection region of the probe apparatus 1.

Figures 2A, 2B, 2C:
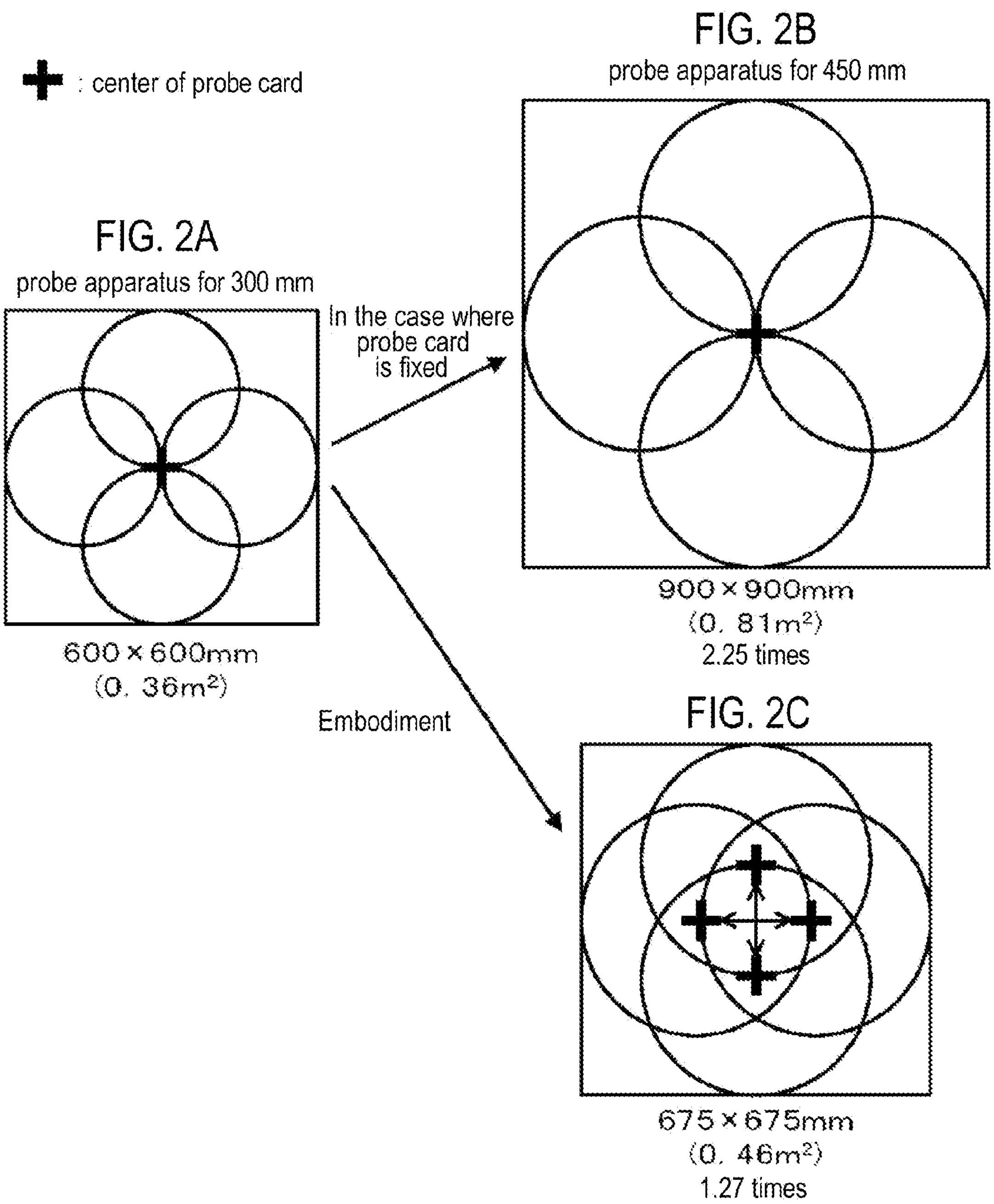
FIGS. 2A to 2C are views illustrating a real estate of a wafer inspection region of a probe apparatus according to some embodiments, respectively.

In a conventional probe apparatus for 300 mm semiconductor wafer in which a probe card is fixed, there is a need to provide contact between the probes of the probe card 20 with all electrodes of the semiconductor device formed on the semiconductor wafer W by moving the wafer chuck 10 on which the semiconductor wafer W is mounted. As shown in FIG. 2A, this configuration essentially requires a space having an area of 0.36 $m^2$ (i.e., 600 mm×600 mm) within which the wafer chuck 10 is moved.

Further, as shown in FIG. 2B, a conventional probe apparatus for 450 mm semiconductor wafer essentially requires a space having an area of 0.81 $m^2$ (i.e., 900 mm×900 mm) within which the wafer chuck 10 is moved. Accordingly, the conventional probe apparatus for 450 mm semiconductor wafer requires a space that is 2.25 times as large as the conventional probe apparatus for a 300 mm semiconductor wafer.

In the embodiment represented by the probe apparatus 1 of FIG. 1, however, as shown by cross marks (each of which indicates the center position of the probe card 20) in FIG. 2C, the probe card 20 is configured to be movable across a total of four positions, i.e., two positions spaced at a certain distance (e.g., a distance corresponding to a radius of the semiconductor wafer W) in a X-direction and two positions spaced at a certain distance (e.g., the distance corresponding to the radius of the semiconductor wafer W) in a Y-direction orthogonal to the X -direction. With this configuration, the area of the space required to move the wafer chuck 10 becomes 675 mm×675 mm=0.46 $m^2$, which makes it possible to restrain the area to be within 1.27 times with respect to the conventional probe apparatus for 300 mm semiconductor wafer.

Figure 3:
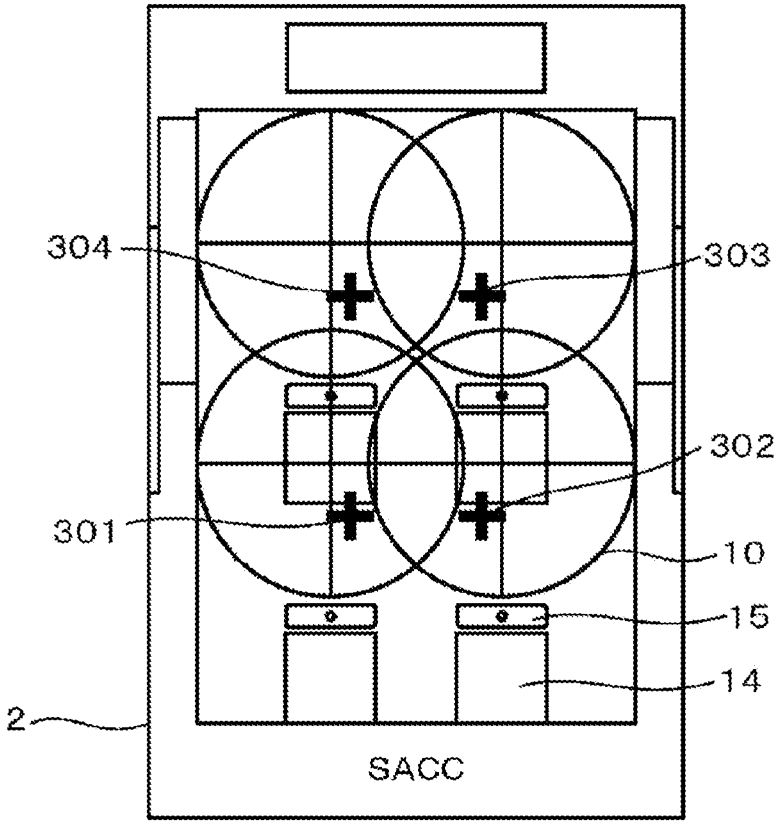
FIG. 3 is a schematic view showing a plane configuration of a probe apparatus according to some embodiments.

Further, as shown in FIG. 3, other components, e.g., the probe polishing board 14 and the camera 15 as shown in FIG. 1, are actually installed in the probe apparatus 1. In some embodiments, the movement range of the wafer chuck 10 may be set such that positions of the probe card 20 are overlapped within a certain range and are contacted with each other. By this configuration, the real estate of the wafer inspection region consumed by the wafers becomes the aforementioned 675 mm×675 mm=0.46 $m^2$ or more.

In an example shown in FIG. 3, a component such as an arm which constitutes an SACC (Semi Automatic Probe Card Changer) configured to exchange the probe card 20 is disposed in a front side (a lower portion in FIG. 3) of the frame 2. In addition, as described above, the probe polishing board 14, the camera 15 and the like are disposed adjacent to the y-direction in the periphery of the wafer chuck 10. In the light of foregoing, a movement distance of the probe card 20 in the y-direction may be set to, e.g., about 335 mm, and a movement distance of the probe card 20 in the x-direction may be set to, e.g., about 225 mm. In this case, an actual dimension (stage dimension) becomes, e.g., about 920 (W) mm×1423 (D) mm. In the arrangement where the probe card 20 is fixed as shown in FIG. 2B, the dimension becomes, e.g., about 1193 (W) mm×1735 (D) mm. In the case of the probe apparatus for 300 mm semiconductor wafer as shown in FIG. 2A (where the probe card 20 is fixed), the dimension becomes, e.g., about 868 (W) mm×1596 (D) mm.

Figure 4:
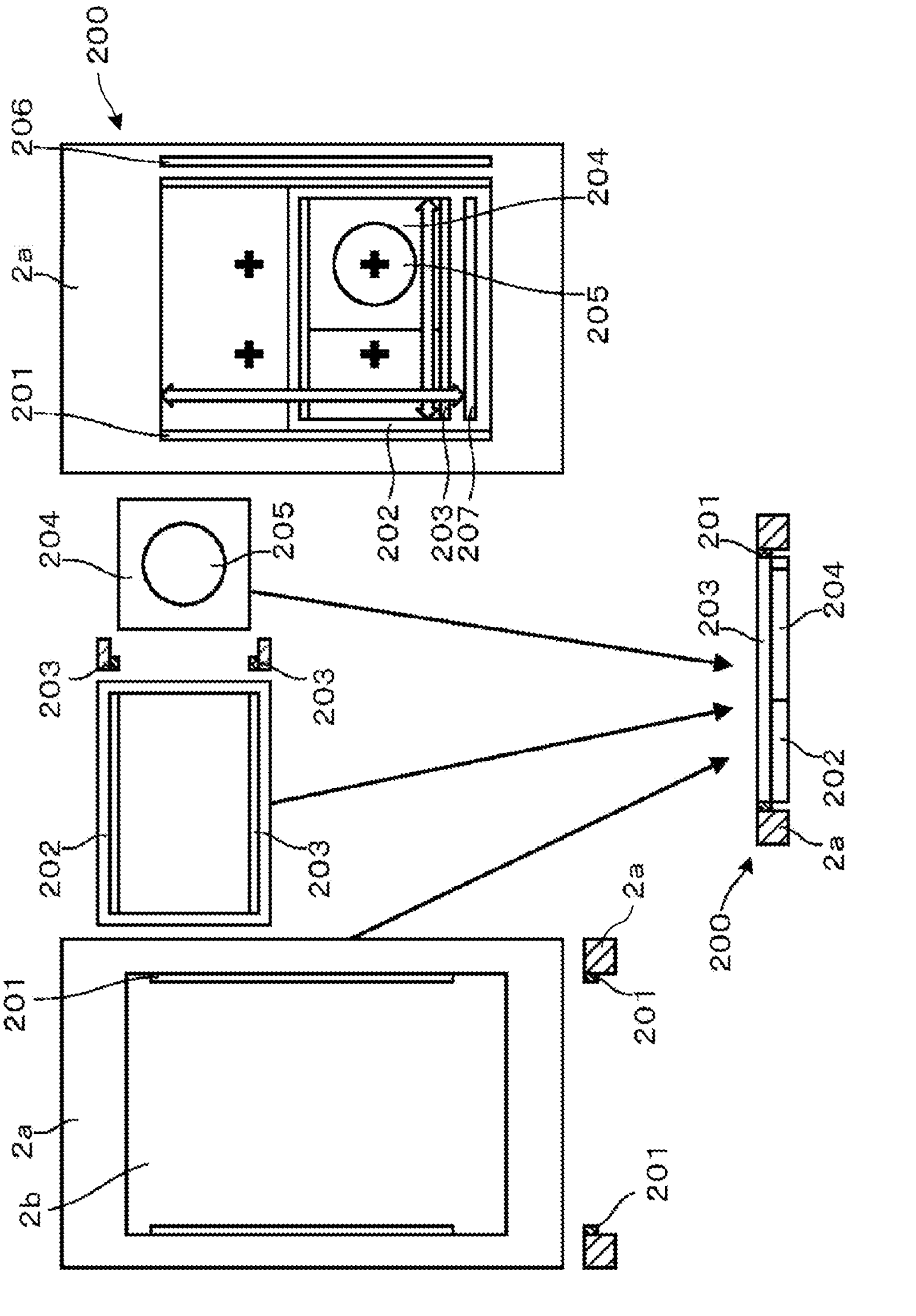
FIG. 4 is a view showing parts of the probe apparatus according to some embodiments.

FIG. 4 is a view showing a configuration of a card movement mechanism 200 which is configured to move the probe card 20 and the like. In the upper portion of FIG. 4, the illustration shown at the most right side shows the configuration of a plan view of the card movement mechanism 200 in a state where respective elements thereof are assembled, and the others are views showing a state where the respective elements are disassembled. The lower portion of FIG. 4 shows a longitudinal sectional view of the card movement mechanism 200 in a state where the respective elements are assembled.

In the card movement mechanism 200 shown in FIG. 4, a rectangular opening 2*b* is formed in a sub-head plate 2*a* which constitutes the frame 2 of the probe apparatus 1. A pair of Y-stage rails 201 is disposed to face each other in the inner sides of the rectangular opening 2*b*. Cross sectional views of the Y-stage rails 201 are shown below the sub-head plate 2*a* in the upper portion of FIG. 4. As shown in this cross sectional views, the Y-stage rails 201 are disposed along sidewalls of the inner sides of the rectangular opening 2*b*, respectively. This configuration makes the thickness of the card movement mechanism 200 relatively thin.

In the Y-stage rails 201, a rectangular frame-like Y-stage 202 is disposed to be movable on the Y-stage rails 201. In the inner sides of the Y-stage 202, a pair of X-stage rails 203 is disposed to face each other in a direction orthogonal to the Y-stage rails 201. Cross sectional views of the X-stage rails 203 are shown at immediately the right side of the Y-stage 202 in the upper portion of FIG. 4. As shown in this cross sectional views, the X-stage rails 203 are disposed along sidewalls of the inner sides of the Y-stage 202, respectively. This configuration makes the thickness of the card movement mechanism 200 relatively thin.

In the X-stage rails 203, a rectangular X-stage 204 is disposed to be movable on the X-stage rails 203. A circular opening 205 is formed in the X-stage 204. The insert ring 12, the card clamp mechanism 13 and the like, which are shown in FIG. 1, are disposed in a peripheral portion of the opening 205. A lock mechanism (not shown) configured to fix the test head 30 shown in FIG. 1 is installed in the X-stage 204.

The configuration of a plan view of the card movement mechanism 200 in a state where the Y-stage 202 and the X-stage 204 are incorporated in the sub-head plate 2*a*, is shown at the most right side in the upper portion of FIG. 4. As shown in FIG. 4, the card movement mechanism 200 includes a Y-stage driving actuator 206 and an X-stage driving actuator 207, which may be constituted by, e.g., an air cylinder, or a ball screw, a motor and the like. The X-stage 204 is configured to be movable to four positions (each is indicated by a cross mark in FIG. 4) which are spaced at a predetermined distance in X and Y directions, respectively.

The Y-stage driving actuator 206 is disposed in the sub-head plate 2*a* and the X-stage driving actuator 207 is disposed in the Y-stage 202. In some embodiments, since a portion excluding a sector covered by the X-stage 204 in the opening 2*b* of the sub-head plate 2*a* is opened, a shutter such as a bellows configured to cover the opened portion may be installed.

As shown in FIG. 1, the probe apparatus 1 configured as above is controlled by a control unit 40 including a CPU (Central Processing Unit) and the like such that the entire operation of the probe apparatus 1 is controlled. The control unit 40 includes a manipulation unit 41 and a storage unit 42.

The manipulation unit 41 is equipped with a keyboard for allowing a process manager to manipulate inputs such as a command input to manage the probe apparatus 1, a display for visualizing and displaying the running status of the probe apparatus 1, and the like.

In the storage unit 42, there are stored recipes having control programs (software) to be executed by the control unit 40 to implement various processes (e.g., movements of the probe card 20 and the wafer chuck 10, which will be described later) performed in the probe apparatus 1 and related inspection condition data. If necessary, by reading any recipe from the storage unit 42 according to an instruction from the manipulation unit 41 and executing it by means of the control unit 40, the probe apparatus 1 may perform the various processes under the control of the control unit 40. In addition, the recipes such as the control program and process condition data may be used by installing those stored in a computer-readable recording medium (e.g., a hard disk, a CD-ROM, a flexible disk, a semiconductor memory or the like). Alternatively, the recipes may be downloaded online from other apparatuses via, for example, a dedicated line.

When the electrical inspection for the semiconductor device formed on the semiconductor wafer W is performed using the probe apparatus 1 configured as above, the semiconductor wafer W is mounted on the wafer chuck 10. Subsequently, in a state where the probe card 20 is disposed at any one (e.g., a first position 301 in FIG. 3) of the aforementioned four positions (where are indicated by the cross marks in FIG. 3), the semiconductor wafer W is moved by the wafer chuck 10 and each electrode of the semiconductor wafer W is brought into contact with a corresponding probe of the probe card 20 such that an electrical conduction is established. Thereafter, the normality of an electrical characteristic of the semiconductor device is inspected by a tester connected to the test head 30.

If all inspections for the semiconductor device are completed at the first position 301, the probe card 20 is moved to a next position (e.g., a second position 302 shown in FIG. 3) where the normality of the electrical characteristic of the semiconductor device is inspected in a similar manner.

If the inspection for the semiconductor device is completed at the second position 302, the probe card 20 is moved to a subsequent position (e.g., a third position 303 shown in FIG. 3) where the normality of the electrical characteristic of the semiconductor device is inspected in a similar manner. Subsequently, the inspection for the semiconductor device is completed at the third position 303, the probe card 20 is moved to a subsequent position (e.g., a fourth position 304 shown in FIG. 3) where the normality of the electrical characteristic of the semiconductor device is inspected in a similar manner.

In this way, in the probe apparatus 1 according to this embodiment, the probe card 20 is sequentially moved from the first position 301 to the fourth position 304 by the card movement mechanism 200 such that all the inspections for the semiconductor device formed on the semiconductor wafer W can be performed. Further, it is possible to decrease the entire size compared with the case where the probe card 20 is fixed without including the card movement mechanism 200, which decreases the real estate of the wafer inspection region of the probe apparatus 1.

While in the foregoing embodiment, the card movement mechanism 200 has been described to be movable in the X and Y directions and the probe card 20 has been described as being moved to the four positions (i.e., the first position 301 to the fourth position 304), the card movement mechanism 200 may be moved in only the X direction or only the Y direction. Alternatively, the probe card 20 may be moved to more than four positions in conjunction with a movement operation of the card movement mechanism 200.

Figure 5:
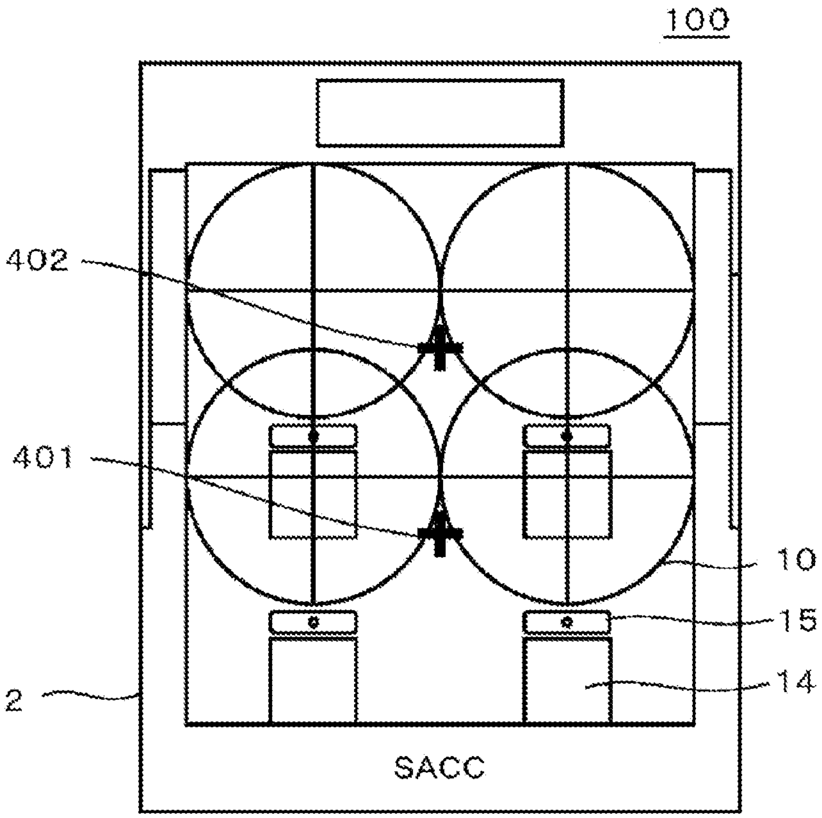
FIG. 5 is a schematic sectional view showing a configuration of a probe apparatus according to some other embodiments.

FIG. 5 shows another configuration of a probe apparatus 100 including a mechanism configured to drive in only the Y direction. In this example, the probe card 20 and the like can be configured to move to two positions spaced at a certain distance in the Y direction, i.e., a first position 401 and a second position 402 which are indicated by cross marks in FIG. 5. In this case, the actual dimension may be set to, e.g., about 1193 (W) mm×1423 (D) mm.

Figure 6:
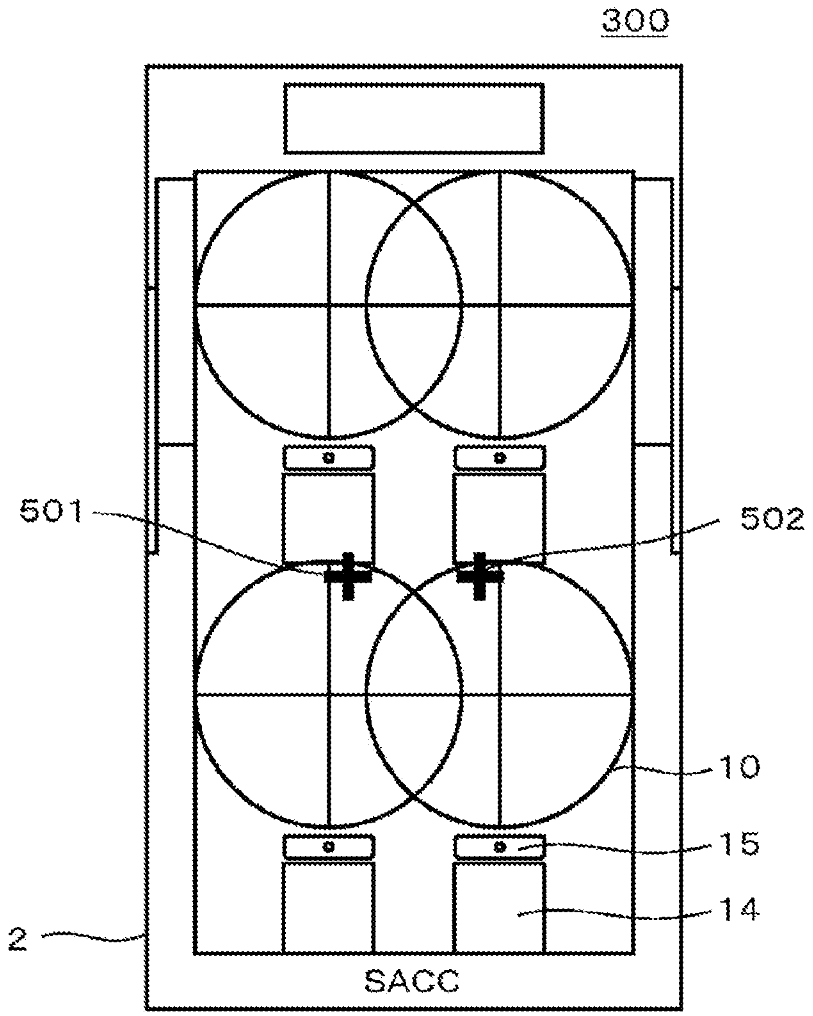
FIG. 6 is a schematic sectional view showing a configuration of a probe apparatus according to some other embodiments.

FIG. 6 shows an exemplary configuration of a probe apparatus 300 including a mechanism configured to drive in only the X direction. In this example, the probe card 20 and the like can be configured to move to two positions spaced at a certain distance in the X direction, i.e., a first position 501 and a second position 502 which are indicated by cross marks in FIG. 6. In this case, the actual dimension may be set to, e.g., about 920 (W) mm×1735 (D) mm.

As described above, even when the card movement mechanism 200 is configured to be movable to only the X direction or the Y direction, it is possible to decrease the real estate of the wafer inspection region compared with the case where no the card movement mechanism 200 is provided (e.g., 1193 (W) mm×1735 (D) mm)

According to the present disclosure, it is possible to provide a probe apparatus which is capable of further decreasing the real estate of a wafer inspection region compared with the conventional apparatus.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A probe apparatus, comprising:

a card clamp mechanism configured to detachably clamp a probe card equipped with a plurality of probes;

a card movement mechanism configured to horizontally move the card clamp mechanism and the probe card clamped by the card clamp mechanism to at least two positions spaced at a predetermined distance; and a wafer chuck configured to mount a semiconductor wafer thereon and configured to move the semiconductor wafer according to an operation of a drive mechanism to provide contact between electrodes formed in the semiconductor wafer and the probes of the probe card clamped by the card clamp mechanism for testing the semiconductor wafer while the probe card clamped by the card clamp mechanism is at each of the at least two positions.

2. The probe apparatus of claim 1, wherein the card movement mechanism is configured to move the card clamp mechanism and the probe card clamped by the card clamp mechanism to two positions spaced apart in an X direction or a Y direction.

3. The probe apparatus of claim 1, wherein the card movement mechanism is configured to move the card clamp mechanism and the probe card clamped by the card clamp mechanism to four positions including two positions spaced apart in the X direction and two positions spaced apart in the Y direction.

4. The probe apparatus of claim 1, wherein the card movement mechanism is configured to move the card clamp mechanism and the probe card clamped by the card clamp mechanism together with a test head of a tester.

5. The probe apparatus of claim 1, further comprising: a control unit is configured to: provide contact between the electrodes formed in the semiconductor wafer with the probes of the probe card by the wafer chuck, in a state where the card clamp mechanism and the probe card clamped by the card clamp mechanism are moved to a first position by the card movement mechanism; and subsequently, move the card clamp mechanism and the probe card clamped by the card clamp mechanism by the card movement mechanism from the first position to a second position spaced at a predetermined distance from the first position so that the electrodes formed in the semiconductor wafer are brought into contact with the probes of the probe card by the wafer chuck.

* * * * *